(12) United States Patent
Tsang (10) Patent No.: US 8,431,956 B2
(45) Date of Patent: Apr. 30, 2013

(54) LIGHT EMITTING CHIP HAVING BUFFER LAYER WITH NITRIDE SEMICONDUCTOR IN CARBON NANO TUBE STRUCTURE (75) Inventor: Jian-Shihn Tsang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 141 days.

(21) Appl. No.: 13/091,141

(22) Filed: Apr. 21, 2011

(65) Prior Publication Data

US 2012/0235205 A1    Sep. 20, 2012

(30) Foreign Application Priority Data

Mar. 14, 2011   (TW) .............................. 100108464 A (51) Int. Cl.
*H01L 29/26* (2006.01)
(52) U.S. Cl.
USPC .............. 257/103; 257/79; 257/190; 438/104

(58) Field of Classification Search ...................... 257/79, 257/103, 190
See application file for complete search history.

(56) References Cited

U.S. PATENT DOCUMENTS

| 5,432,808 | A | * | 7/1995 | Hatano et al. | ............... | 372/45.01 |
| 5,929,466 | A | * | 7/1999 | Ohba et al. | ..................... | 257/103 |
| 2008/0007157 | A1 | * | 1/2008 | Carroll et al. | ................. | 313/504 |

* cited by examiner

*Primary Examiner* — Thanh V Pham
(74) *Attorney, Agent, or Firm* — Altis Law Group, Inc.

(57) ABSTRACT

A light emitting chip includes a substrate, a buffer layer, a cap layer and a light emitting structure. The buffer layer is formed on the substrate and includes a carbon nano tube structure substantially parallel to the substrate. The carbon nano tube structure is comprised of nitride semiconductor. The cap layer grows from the buffer layer. The light emitting structure is formed on the cap layer. The light emitting structure sequentially includes a first cladding layer connected to the cap layer, a light emitting layer, and a second cladding layer.

7 Claims, 8 Drawing Sheets

LIGHT EMITTING CHIP HAVING BUFFER LAYER WITH NITRIDE SEMICONDUCTOR IN CARBON NANO TUBE STRUCTURE

BACKGROUND

1. Technical Field

The present disclosure relates to a light emitting chip and a method for manufacturing the light emitting chip, wherein the light emitting chip has nitride semiconductor for decreasing lattice defects thereof.

2. Description of Related Art

Generally, a light emitting diode (LED) chip includes a buffer layer between a substrate and a semiconductor layer. The buffer layer usually grows on the substrate in low temperature to decrease the lattice mismatches between the substrate and the semiconductor layer. However, the buffer layer grown in low temperature can only decrease the vertical lattice mismatches without decreasing the horizontal lattice mismatches, whereby the lattice defects still exist in the semiconductor layer grown from the buffer layer.

Therefore, it is desirable to provide a light emitting chip and a method for manufacturing the light emitting chip which can overcome the above-mentioned shortcomings.

BRIEF DESCRIPTION OF THE FIGURE

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
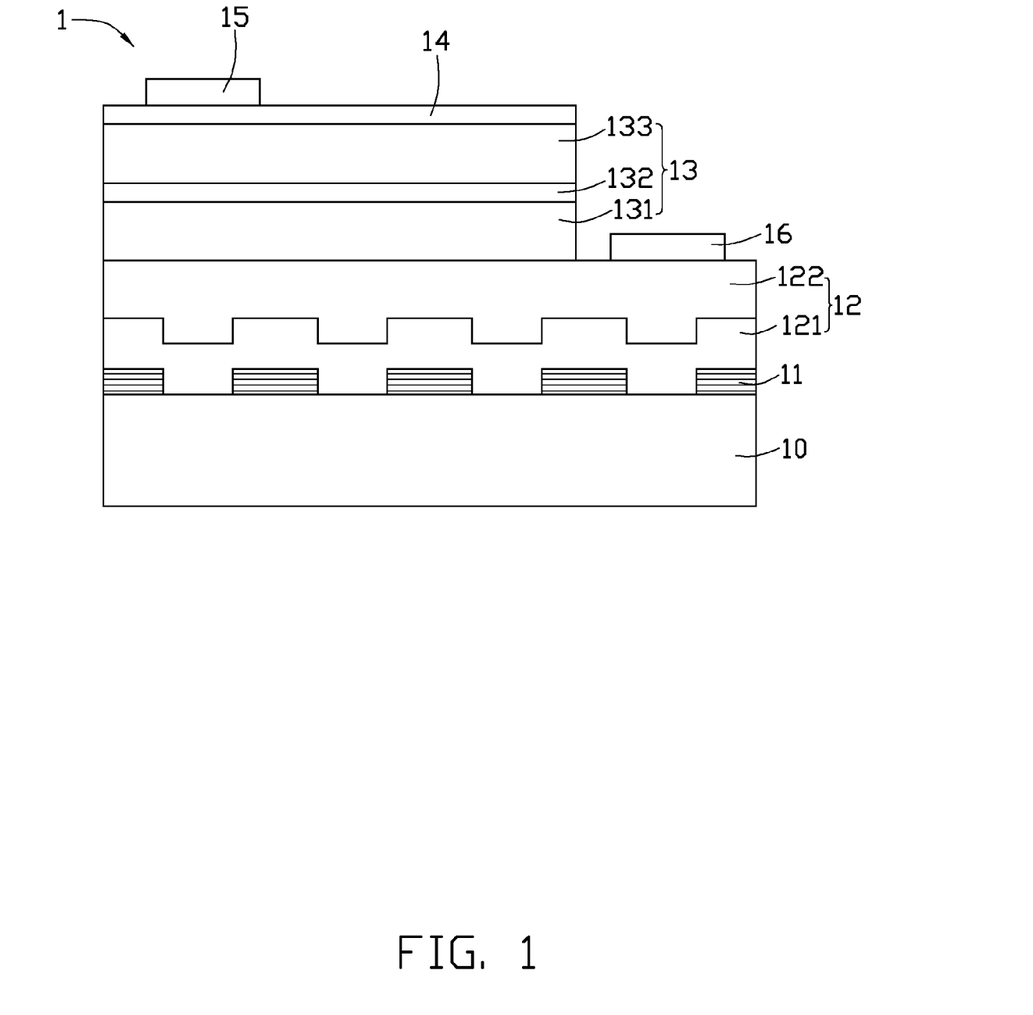
FIG. 1 is a schematic view of a light emitting chip in accordance with a first embodiment of the present disclosure.

Referring to FIG. 1, a light emitting chip 1 in accordance with a first embodiment of the present disclosure is disclosed. The light emitting chip 1 includes a substrate 10, a buffer layer 11 formed on the substrate 10, a cap layer 12 formed on the buffer layer 11, and a light emitting structure 13 formed on the cap layer 12.

The substrate 10 is made of a material with high thermal conductivity, such as $Al_2O_3$, ZnO or other electrically insulating materials. The buffer layer 11 has a carbon nano tube structure formed substantially parallel to the substrate 10. The carbon nano tube structure contains nitride semiconductor, which can be a single wall carbon nanotube. The nitride semiconductor can be made of aluminum indium gallium nitride ($Al_xGa_yIn_{(1-x-y)}N$, $0 \leq x \leq 1$, $0 \leq y \leq 1$, and $0 \leq (1-x-y) \leq 1$). In this embodiment, the buffer layer 11 contains co-axial carbon nanotube which consists of gallium nitride having an inner cavity configured.

The cap layer 12 covers the buffer layer 11, and includes a first film 121 directly contacting the buffer layer 11 and a second film 122 formed on the first film 121. The first film 121 is evenly formed on the substrate 10 and the buffer layer 11, which means that a portion of a top surface of the first film 121 aligned with the buffer layer 11 is higher than that of other portion of the top surface of the first film 121 about a thickness of the buffer layer 11. That is, a vertical distance between the other portion of the top surface of the first film 121 and the substrate 10 is substantially equal to a vertical distance between the portion of the top surface of the first film 121 and the buffer layer 11. In this embodiment, the first film 121 and the second film 122 are both made of aluminum indium gallium nitride ($Al_sGa_tIn_{(1-s-t)}N$, $0 \leq s \leq 1$, $0 \leq t \leq 1$, and $0 \leq (1-s-t) \leq 1$), and the difference between them is that the Group III metal contents of the first film 121 and the second film 122, such as the consistencies of Al, In, and Ga are different, or the manufacturing temperatures are different. Therefore, the buffer layer 11, the first film 121 and the second film 122 are formed by the same base material, thereby crystal quality of the light emitting structure 13 formed on the cap layer 12 can be efficiently improved.

The light emitting structure 13 includes a first cladding layer 131, a light emitting layer 132, and a second cladding layer 133 arranged one on the other in that order along a direction away from the cap layer 12. In this embodiment, the first cladding layer 131 is an N-type aluminum indium gallium nitride layer, the second cladding layer 133 is a P-type aluminum indium gallium nitride layer, and the light emitting layer 132 is a multi-quantum well aluminum indium gallium nitride layer. Alternatively, the first cladding layer 131, the light emitting layer 132, and the second clapping layer 133 can be made of other materials.

The light emitting chip 1 further includes a transparent conductive layer 14 formed on a top surface of the second cladding layer 133, to distribute current to uniformly flow through the first and second cladding layers 131, 133. The transparent conductive layer 14 may be made of ITO (Indium Tim Oxide) or an alloy of Ni/Au.

The light emitting chip 1 further includes a first electrode 15 and a second electrode 16. The first electrode 15 is formed on a top surface of the transparent conductive layer 14. The second electrode 16 is formed on an exposed part of the second film 122 and parallel to the light emitting structure 13. The first electrode 15 and the second electrode 16 of the light emitting chip 1 are electrically connected with an external circuit structure via metal wires such as golden wires (not shown) so that a driving power can be supplied to the light emitting structure 13.

Since the buffer layer 11 consists of the co-axial carbon nanotube which contains nitride semiconductor (such as the gallium nitride having an inner cavity configured) in horizontal directional, the horizontal lattice mismatches are substantially eliminated by the nitride semiconductor 122. Therefore, the lattice defects in the cap layer 12 and the light emitting structure 13 grown from the nitride semiconductor 122 can be effectively decreased.

Figure 2:
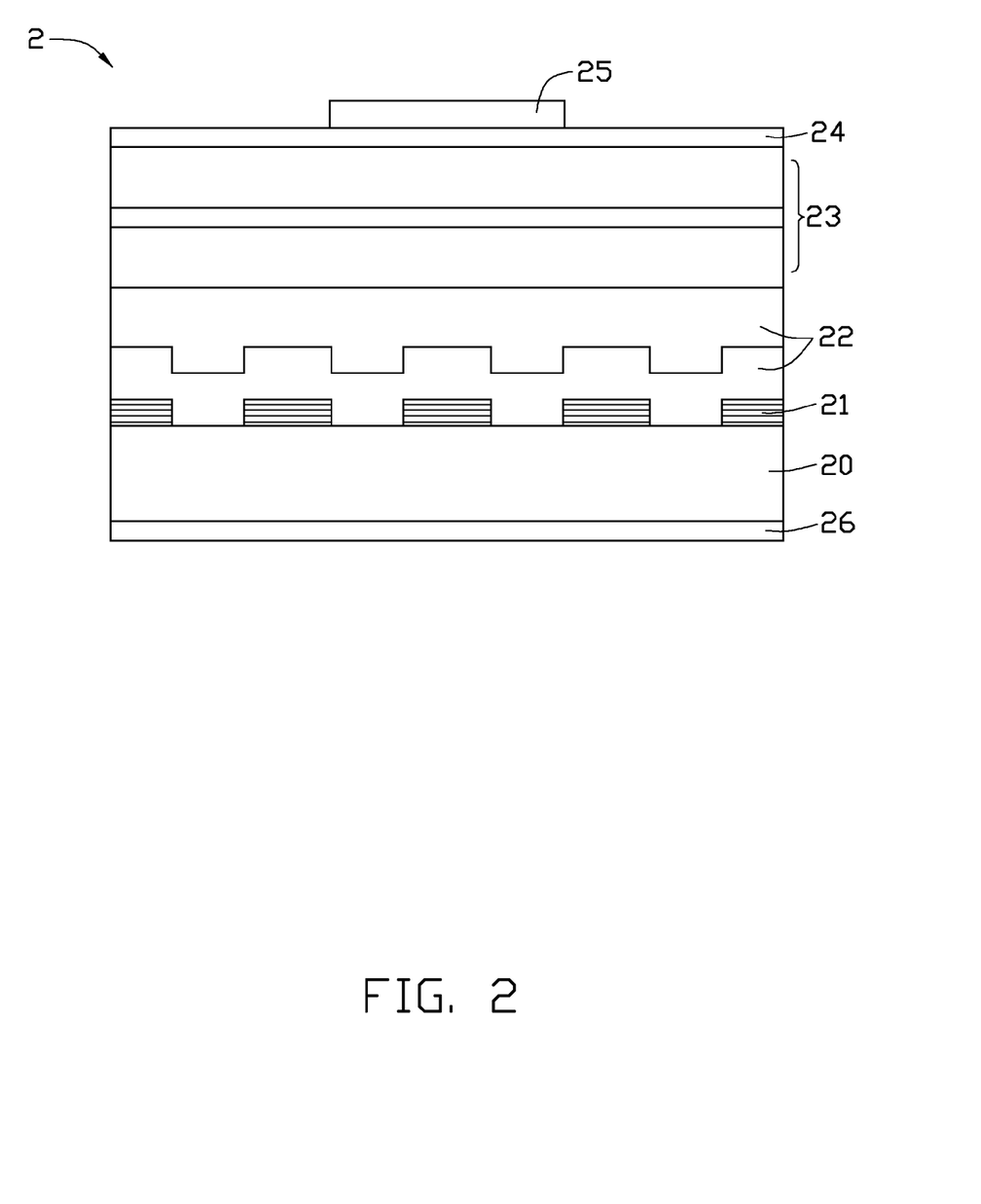
FIG. 2 is a schematic view of a light emitting chip in accordance with a second embodiment of the present disclosure.

Referring to FIG. 2, a light emitting chip 2 in accordance with a second embodiment is provided. The light emitting chip 2 includes a substrate 20, a buffer layer 21, a cap layer 22, a light emitting structure 23, a transparent conductive layer 24, a first electrode 25 and a second electrode 26. The light emitting chip 2 is similar to the light emitting chip 1 of the first embodiment, except that the substrate 20 is made of Si, SiC, GaN or other conducting materials with high thermal conductivity. In this embodiment, the light emitting structure 23 covers an entire top side of the cap layer 22. The first electrode 25 is formed on a top surface of the transparent conductive layer 24, and the second electrode 26 is formed on a bottom surface of the substrate 20. Advantageously, the second electrode 26 is an ohmic contact layer to form an excellent ohmic contact with the substrate 20.

The buffer layer 21 is substantially same as the buffer layer 11 of the first embodiment, and consists of the co-axial carbon nanotube which contains nitride semiconductor (such as the gallium nitride having an inner cavity configured) in horizontal direction, the horizontal lattice mismatches are substantially eliminated by the cap layer 22. Therefore, the lattice defects in the light emitting structure 23 grown from the cap layer 22 can be effectively decreased.

Referring to FIGS. 3-8, a method for manufacturing the light emitting chip 1 of the present disclosure is disclosed as follows.

Figure 3:
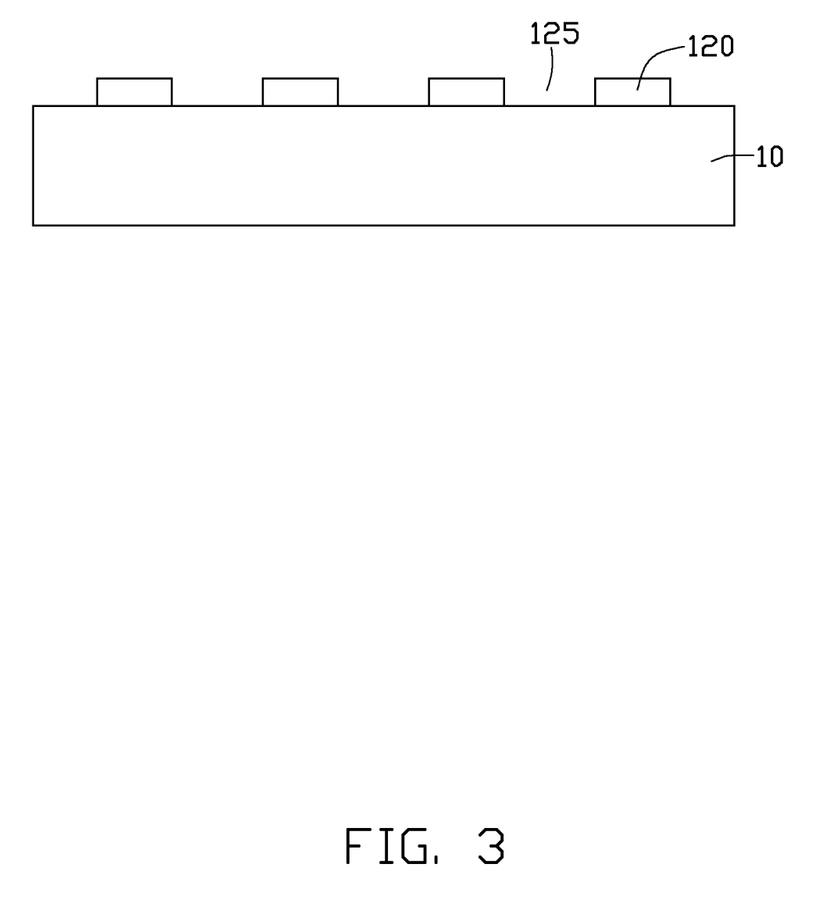
FIGS. 3-8 are schematic views showing, in sequence, different steps during manufacture of the light emitting chip of FIG. 1.

As shown in FIG. 3, firstly, an electrically insulating substrate 10 is provided with a catalyst layer 120 formed thereon. The catalyst layer 120 is etched to form a number of patterns which are spaced from each other by multiple gaps 125, such as a number of elongated, protruded columns or an array of rectangular blocks (not shown). The material of the catalyst layer 120 may be selected from Au, Ag, Fe, Co, Ni, Mo or other suitable transition metals. The catalyst layer 120 is used for providing growing medium. The catalyst layer 120 can be grown on a top surface of the substrate 10 via MOCVD (Metal-Organic Chemical Vapor Deposition) method or other suitable methods.

Figure 4:
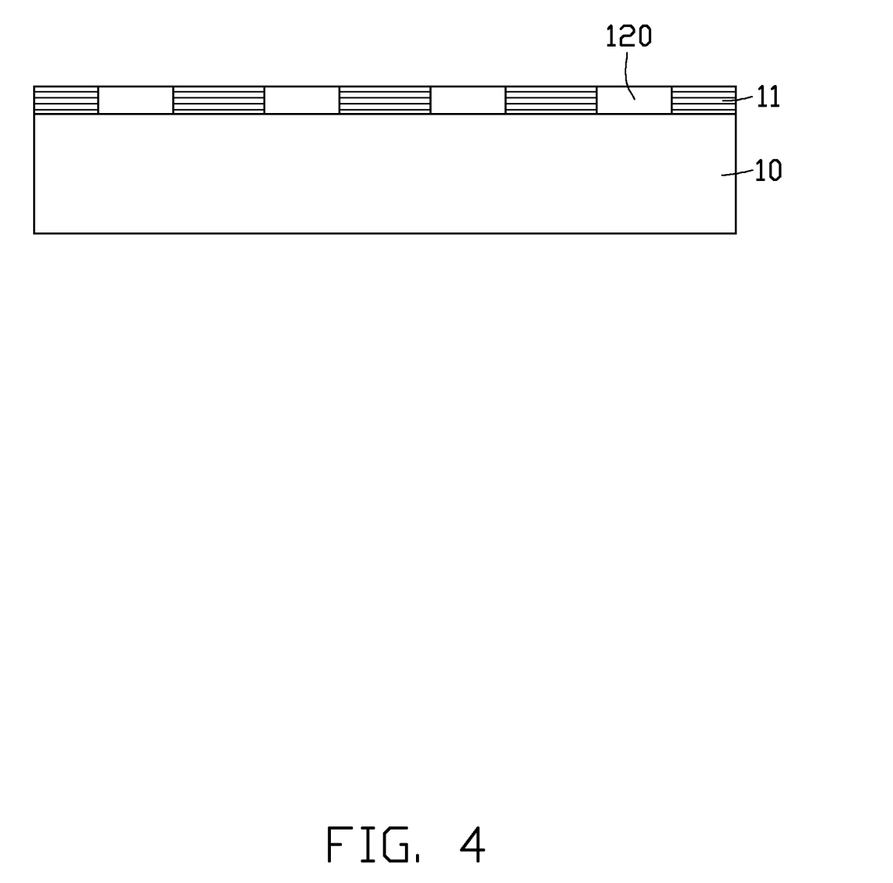

As shown in FIG. 4, a buffer layer 11 is then formed on the substrate 10 to fill the multiple gaps 125 of the patterned catalyst layer 120. The buffer layer 11 has a patterned carbon nano tube structure formed along an extending direction of the substrate 10. Each part of the patterned carbon nano tube structure is extended from a lateral side of a corresponding pattern to an opposite side of an adjacent pattern of the catalyst layer 120 so that the whole buffer layer 11 is continuously formed on the substrate 10 along a horizontal direction. The carbon nano tube structure contains nitride semiconductor, which can be a single wall carbon nanotube. The nitride semiconductor can be aluminum indium gallium nitride ($Al_xGa_yIn_{(1-x-y)}N$, $0 \leq x \leq 1$, $0 \leq y \leq 1$, and $0 \leq (1-x-y) \leq 1$). Particularly, the co-axial carbon nanotube of the buffer layer 11 containing gallium nitride having an inner cavity configured is horizontally grown from the catalyst layer 120 by reaction of a gas combination containing $N_2$, TMG (Trimethylgallium), and $NH_3$ in the gaps between two adjacent patterns of the catalyst layer 120. The growth direction of the gallium nitride having an inner cavity configured can be controlled by selecting the growth condition, such as the chemical composition, proportion, partial pressure, and temperature of the gas combination, or by selecting the particular lattice direction of the substrate 10 as the growth surface of the buffer layer 11, for example the $\alpha$ plane (11-20) or the $\gamma$ plane (1-102) of sapphire. Thereby, the co-axial carbon nanotube which contains gallium nitride having an inner cavity is horizontally grown in the gaps between two adjacent patterns of the catalyst layer 120.

Figure 5:
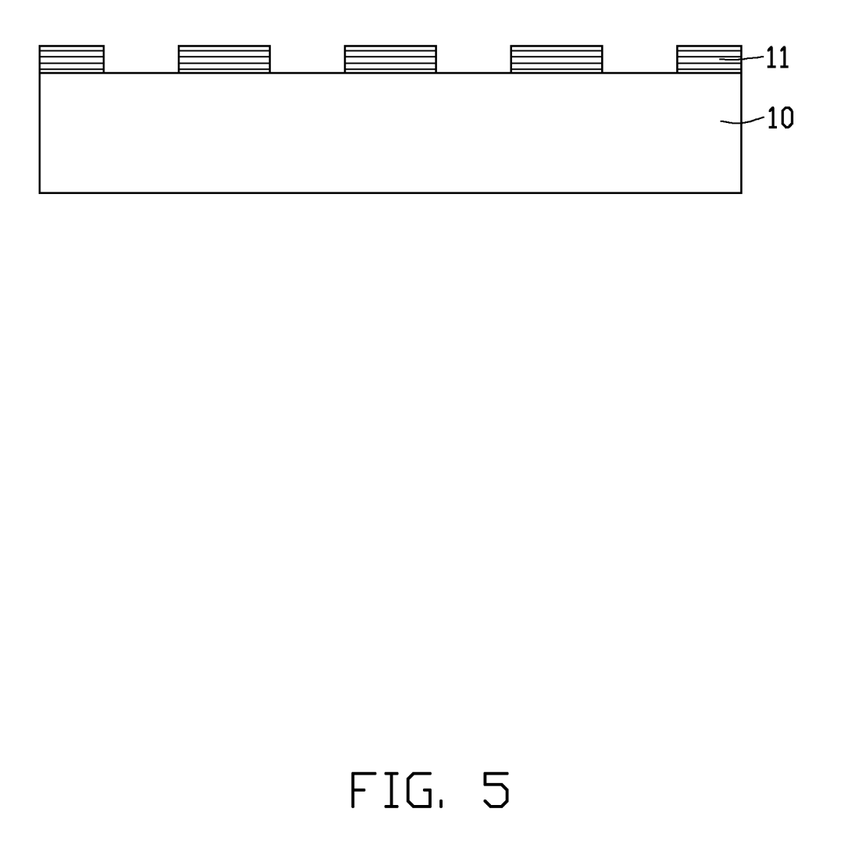

As shown in FIG. 5, the catalyst layer 120 is then removed from the substrate 10 by chemical etching, plasma etching, or laser etching.

Figure 6:
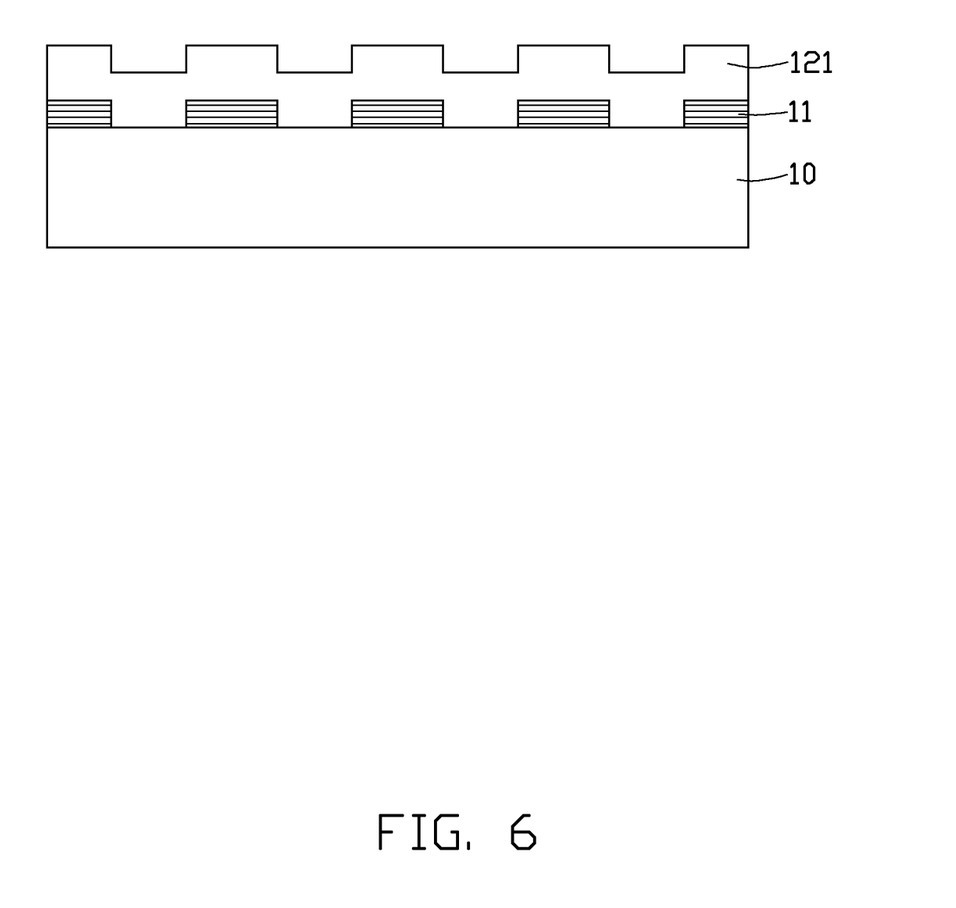

As shown in FIG. 6, the first film 121 is then grown on the substrate 10 in low temperature; the first film 121 consists of aluminum indium gallium nitride ($Al_sGa_tIn_{(1-s-t)}N$, $0 \leq s \leq 1$, $0 \leq t \leq 1$, and $0 \leq (1-s-t) \leq 1$).

Figure 7:
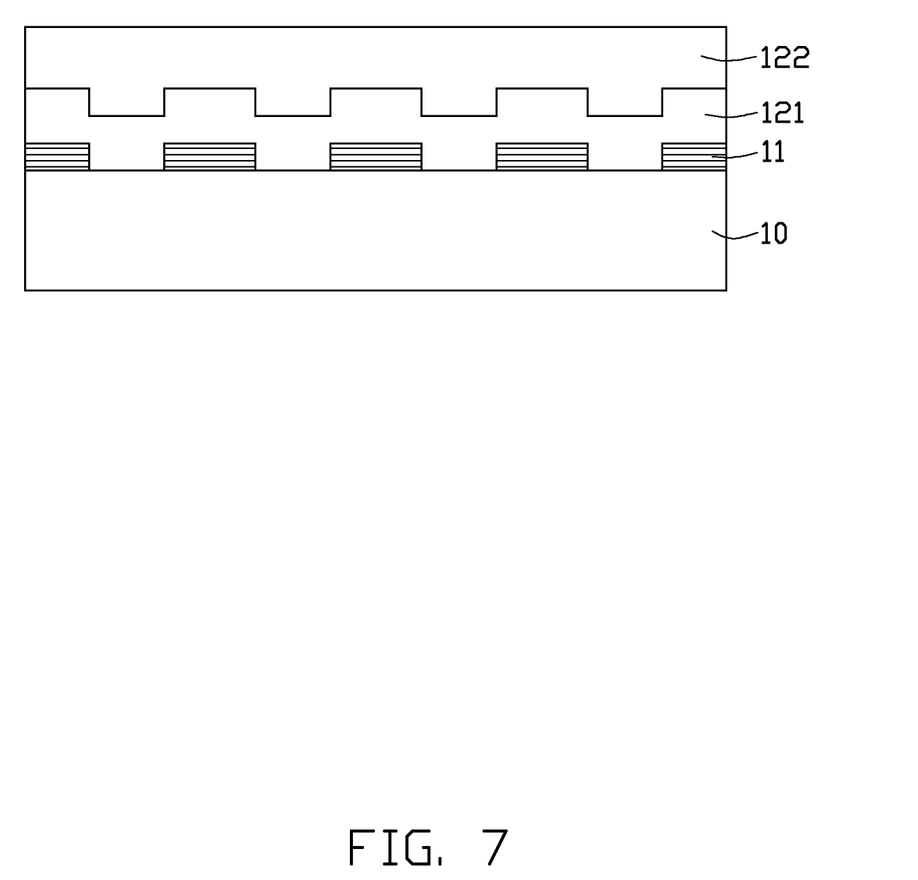

As shown in FIG. 7, the second film 122 is then grown on the first film 121 in high temperature; the second film 122 also consists of aluminum indium gallium nitride ($Al_uGa_vIn_{(1-u-v)}N$, $0 \leq u \leq 1$, $0 \leq v \leq 1$, and $0 \leq (1-u-v) \leq 1$). The Group III metal content of the first film 121 may be different from that of the second film 122. The doping concentration of the first film 121 can be the same as or different from that of the second film 122.

Figure 8:
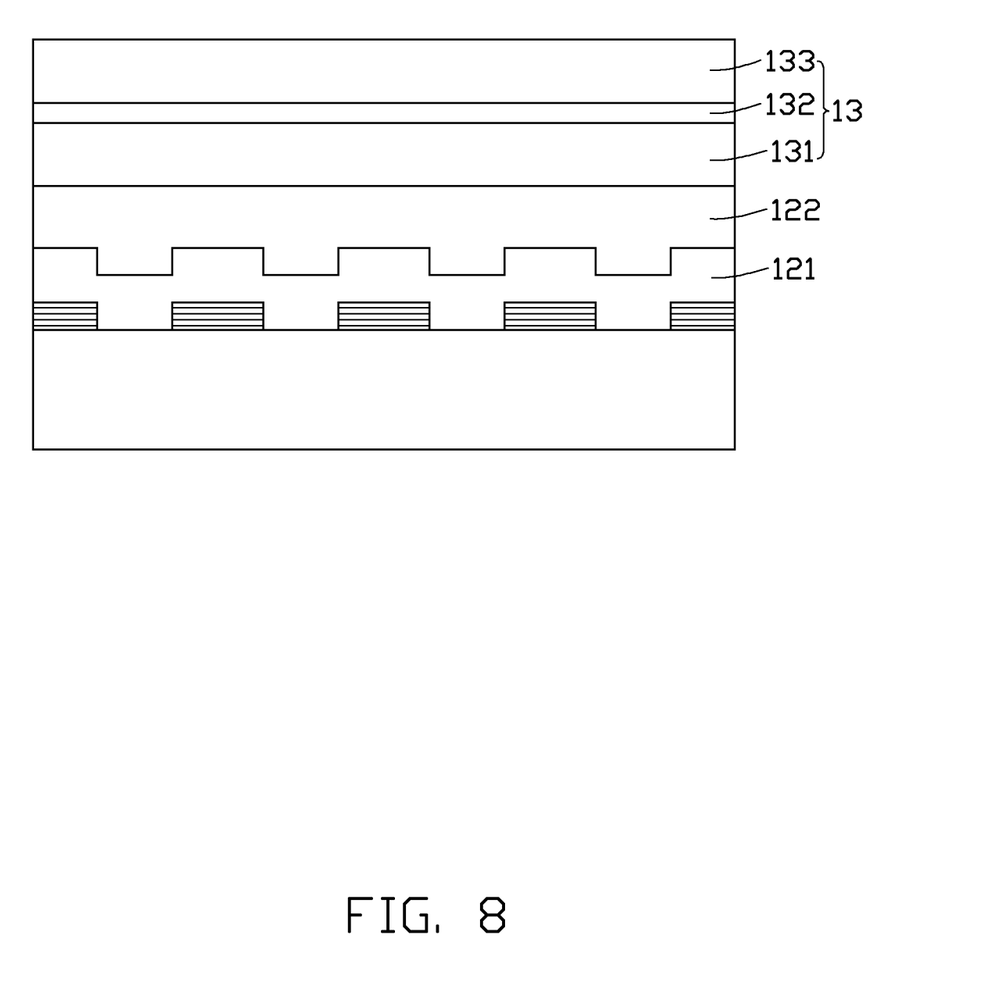

As shown in FIG. 8, the light emitting structure is then grown 13 on the second film 122; the light emitting structure 13 sequentially includes the first cladding layer 131 connected to a top surface of the second film 122, a light emitting layer 132, and a second cladding layer 133.

As shown in FIG. 1, the light emitting structure 13 is then etched to expose a part of the second film 122 in a lateral side thereof. Thereafter, the transparent conductive layer 14 is formed on the top surface of the second clapping layer 133. Finally, the first electrode 15 and the second electrode 16 are formed on the transparent conductive layer 14 and the exposed part of the second film 122, respectively.

Since the buffer layer 11 contains the co-axial carbon nanotube which consists of nitride semiconductor (such as the gallium nitride having an inner cavity configured) in horizontal direction, the horizontal lattice mismatches are substantially eliminated by the nitride semiconductor 122. Therefore, the lattice defects in the cap layer 12 and the light emitting structure 13 grown from the nitride semiconductor 122 can be effectively decreased.

While various embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A light emitting chip comprising:
   a substrate;
   a buffer layer formed on the substrate, the buffer layer comprising a carbon nano tube structure substantially parallel to the substrate, the carbon nano tube structure being comprised of nitride semiconductor;
   a cap layer formed on the nitride semiconductor; and
   a light emitting structure formed on the cap layer, the light emitting structure sequentially comprising a first cladding layer, a light emitting layer, and a second cladding layer.

2. The light emitting chip as claimed in claim 1, wherein the nitride semiconductor is $Al_xGa_yIn_{(1-x-y)}N$, in which $0 \leq x \leq 1$, $0 \leq y \leq 1$, and $0 \leq (1-x-y) \leq 1$.

3. The light emitting chip as claimed in claim 1, wherein the cap layer is $Al_sGa_tIn_{(1-s-t)}N$, in which $0 \leq s \leq 1$, $0 \leq t \leq 1$, and $0 \leq (1-s-t) \leq 1$.

4. The light emitting chip as claimed in claim 3, wherein the cap layer comprises a first film directly contacting the buffer layer and a second film formed on the first film, and the Group III metal contents of the first film and the second film are different.

5. The light emitting chip as claimed in claim 1, further comprising a transparent conductive layer formed on a top of the second cladding layer.

6. The light emitting chip as claimed in claim 5, further comprising a first electrode formed on a top of the transparent conductive layer and a second electrode formed on a bottom of the substrate, the substrate being electrically conductive.

7. The light emitting chip as claimed in claim 5, further comprising a first electrode formed on a top of the transparent conductive layer and a second electrode formed on an exposed part of the cap layer, the substrate being electrically insulating.

* * * * *